(12) United States Patent
Yamazaki et al.

(10) Patent No.: US 7,808,331 B2
(45) Date of Patent: Oct. 5, 2010

(54) CURRENT-CONTROLLED OSCILLATOR

(75) Inventors: Daisuke Yamazaki, Kawasaki (JP);
Andrzej Radecki, Shinagawa (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 11/892,700

(22) Filed: Aug. 27, 2007

(65) Prior Publication Data
US 2008/0007352 A1 Jan. 10, 2008

Related U.S. Application Data

(63) Continuation of application No. PCT/JP2005/003341, filed on Feb. 28, 2005.

(51) Int. Cl.
G01K 7/00 (2006.01)
H03K 3/02 (2006.01)
(52) U.S. Cl. ...................... 331/143; 331/111
(58) Field of Classification Search ........... 331/111, 331/113 R, 143–145
See application file for complete search history.

(56) References Cited

U.S. PATENT DOCUMENTS

| 5,565,817 | A |  | 10/1996 | Lakshmikumar |
| 5,594,388 | A | * | 1/1997 | O'Shaughnessy et al. ... 331/1 R |
| 5,614,871 | A |  | 3/1997 | Miyabe |
| 6,107,894 | A | * | 8/2000 | Van Tuijl et al. ............ 331/143 |
| 6,172,573 | B1 |  | 1/2001 | Lim |
| 6,680,656 | B2 |  | 1/2004 | Chen |
| 7,236,061 | B2 | * | 6/2007 | Lin ............................... 331/66 |

FOREIGN PATENT DOCUMENTS

| JP | 61-206308 | A | 9/1986 |
| JP | 03-182115 | A | 8/1991 |
| JP | 6-177719 | A | 6/1994 |
| JP | 08-265108 | A | 10/1996 |
| JP | 9-294068 | A | 11/1997 |
| JP | 10-070440 | A | 3/1998 |
| KR | 2000-0026324 | A | 5/2000 |

OTHER PUBLICATIONS

"Encyclopedia Electronics, Information and Communication Handbook", Handbook Committee of the IEICE, Ohmsha, Ltd., Nov. 30, 1998, first impression of the first edition.
Razavl, Behzad , "Design of Analog CMOS Integrated Circuits", Japanese translation supervised by Tadahiro Kuroda, Maruzen Co., Ltd., Mar. 30, 2003 (pp. 70-72, Fig. 3.14).

* cited by examiner

*Primary Examiner*—Robert Pascal
*Assistant Examiner*—James E Goodley
(74) *Attorney, Agent, or Firm*—Arent Fox LLP

(57) ABSTRACT

Widening the frequency range without increasing the power consumption. Current circuits output charge current based on control current. Capacitors are provided in association with the current circuits and store the charge current. Discharge transistors are provided in association with the capacitors and cause the capacitors to discharge electric charge. On-off transistors are connected between the current circuits and the capacitors and open or close the paths between the current circuits and the capacitors in accordance with the voltages across the capacitors. Signal output transistors have their gates connected between the current circuits and the on-off transistors and output signals to a flip-flop in accordance with the charge current. The flip-flop drives the discharge transistors alternately in accordance with the signals.

7 Claims, 11 Drawing Sheets

CURRENT-CONTROLLED OSCILLATOR

This application is a continuing application, filed under 35 U.S.C. §111(a), of International Application PCT/JP2005/003341, filed Feb. 28, 2005.

BACKGROUND

1. Field

The present embodiment relates to current-controlled oscillators, and particularly to a current-controlled oscillator in which an oscillation frequency is changed in accordance with control current.

2. Description of the Related Art

Oscillators controlled by current or voltage are widely used in basic parts of data communication systems such as a clock recovery circuit and a phased lock loop (PLL) in a bit synchronization block. These oscillators include current-controlled oscillators using two grounded capacitors and voltage-controlled oscillators (for example, refer to: M. Flynn and S. Lindholm, "A 1.2-μm CMOS Current-Controlled Oscillator," In IEEE Journal of Solid State Circuits, Vol. 27, No. 7, pp. 982-987, July 1992; M. Banu, "MOS oscillators with multi-decade tuning range and gigahertz maximum speed," IEEE J. Solid-State Circuits, vol. 23, pp. 1386-1393, December 1988; and Japanese Unexamined Patent Application Publication No. 08-265108).

FIG. 9 is a schematic diagram of a conventional current-controlled oscillator using two grounded capacitors. As shown in the figure, the current-controlled oscillator includes PMOS transistors M101, M103, and M105 to M107, NMOS transistors M102 and M104, capacitors C101 and C102, a current source I101, comparators 101 and 102, and an RS flip-flop 103.

The transistors M101, M102, and M106 and the capacitor C101 form one delay circuit, and the transistors M103, M104, and M107 and the capacitor C102 form another delay circuit. Oscillation signals are generated through alternate charging and discharging of the capacitors C101 and C102 of the individual delay circuits.

The transistors M105, M106, and M107 form current mirror circuits. The current mirror circuits return current from the current source I101 to the transistors M106 and M107.

In the delay circuit that includes the transistors M101 and M102, when a low signal is input to their gates, the transistor M101 is turned on, and the transistor M102 is turned off. This causes the capacitor C101 to store current (electric charge) from the transistor M106. When a high signal is input to the gates of the transistors M101 and M102, the transistor M101 is turned off, and the transistor M102 is turned on. This connects the capacitor C101 to a node of a voltage Vss (the ground voltage of a power supply having a voltage Vdd), and the stored electric charge is discharged. Like the transistors M101 and M102 and the capacitor C101, the transistors M103 and M104 and the capacitor C102, which form the other delay circuit, charge and discharge current flowing from the transistor M107.

The voltages across the capacitors C101 and C102 are input to the comparators 101 and 102 respectively. The comparators 101 and 102 receive a reference voltage Vref, compare the voltages of the capacitors C101 and C102 with the reference voltage Vref, and output the comparison results to the flip-flop 103. For instance, the comparator 101 or 102 outputs a high signal when the voltage across the capacitor C101 or C102 is higher than the reference voltage Vref.

In the flip-flop 103, the signal from the comparator 101 is input to an "S" terminal, and the signal from the comparator 102 is input to an "R" terminal. When the signal input to the "S" terminal goes high, the flip-flop 103 outputs a high signal from a "Q" terminal. In other words, when the capacitor C101 stores electric charge to a voltage level exceeding the reference voltage Vref, the flip-flop 103 outputs a high signal from the "Q" terminal. The high signal output from the "Q" terminal is output to the gates of the transistors M101 and M102. This turns on the transistor M102, and the capacitor C101 discharges the electric charge.

The high signal input to the "S" terminal causes the flip-flop 103 to output a low signal from an "XQ" terminal. This turns on the transistor M103, and the capacitor C102 stores electric charge. When the capacitor C102 is charged to a voltage level exceeding the reference voltage Vref, the comparator 102 outputs a high signal. The high signal is input to the "R" terminal and causes the flip-flop 103 to output a low signal from the "Q" terminal and a high signal from the "XQ" terminal. This causes the capacitor C101 to store electric charge and the capacitor C102 to be discharged.

The alternate charging and discharging of the capacitors C101 and C102 provide oscillation signals from nodes N101 and N102 shown in the figure. By controlling the amount of current of the current source I101, the charging speed of the capacitors C101 and C102 can be changed, and the frequency of the oscillation signals can be changed.

FIG. 10 is a view illustrating the charging and discharging of a capacitor. Lines W101 and W102 shown in the figure represent changes in voltage across the capacitor C101 (node N101). Lines W103 and W104 represent changes in voltage across the capacitor C102 (node N102).

As the line W101 indicates, current flowing from the transistor M106 increases the voltage across the capacitor C101. When the voltage across the capacitor C101 reaches the reference voltage Vref input to the comparator 101, electric charge is discharged, as indicated by the line W102, and the capacitor C102 stores electric charge, as indicated by the line W103. When the charging brings the voltage level across the capacitor 102 to the reference voltage Vref, the capacitor C102 discharges electric charge, as indicated by the line W104. The charging and discharging repeated by the capacitors C101 and C102 produce the oscillation signals.

A period T of the current-controlled oscillator shown in the figure is given by the following expression (1).

$$T=2(C*Vref/Ic+Td) \qquad (1)$$

where C is the capacitance of the capacitors C101 and C102, Ic is current flowing through the capacitors C101 and C102, and Td is a delay time caused by the comparators 101 and 102 (period taken to compare the voltages). Therefore, the frequency f of the oscillation signal can be given by the following expression (2).

$$f=Ic/\{2*(C*Vref+Td*Ic)\} \qquad (2)$$

FIG. 11 is a view showing the relationship between the current stored in a capacitor and the frequency of the oscillation signal. A line W111 in the figure represents an ideal relationship between the current of the current source I101 and the frequency. A line W112 represents an actual relationship between the current of the current source I101 and the frequency. It is desired that the frequency of the oscillation signal increase in proportion to the increase in current of the current source I101, as indicated by the line W111.

The expression (2) has Ic in the numerator, which means that an increase in current of the current source I101 increases the frequency. However, the denominator also includes Ic, which makes the relationship non-linear, as indicated by the line W112. The delay time Td caused by the comparators 101 and 102 makes the current-frequency relationship non-linear. Consequently, an increase in current of the current source I101 does not increase high frequencies, narrowing the frequency range. The delay caused by the comparators 101 and 102 includes the intrinsic delay of the comparators 101 and 102 and a delay caused by the parasitic capacitance of the transistors M101 to M104 connected to the input stage and the capacitance of the capacitors C101 and C102.

SUMMARY

The embodiment provides that a current-controlled oscillator in which an oscillation frequency is changed in accordance with control current, the current-controlled oscillator including two current circuits outputting charge current based on the control current, capacitors provided in association with the current circuits and storing the charge current, discharge transistors provided in association with the capacitors and causing the capacitors to discharge electric charge, on-off transistors connected between the current circuits and the capacitors, and opening or closing paths between the current circuits and the capacitors in accordance with the voltages across the capacitors, signal output transistors provided in association with the current circuits, and outputting signals in accordance with the charge current output from the current circuits to the on-off transistors and a flip-flop driving the discharge transistors alternately in accordance with the signals.

DETAILED DESCRIPTION OF THE EMBODIMENTS

The delay caused by the comparators 101 and 102 narrows the frequency range of the oscillation signals.

If the speed of comparison by the comparators 101 and 102 is enhanced to widen the frequency range, the power consumption would increase.

In view of the foregoing, it is an object of the embodiment to provide a current-controlled oscillator which can widen the frequency range of the oscillation signals without increasing the power consumption.

Figure 1:
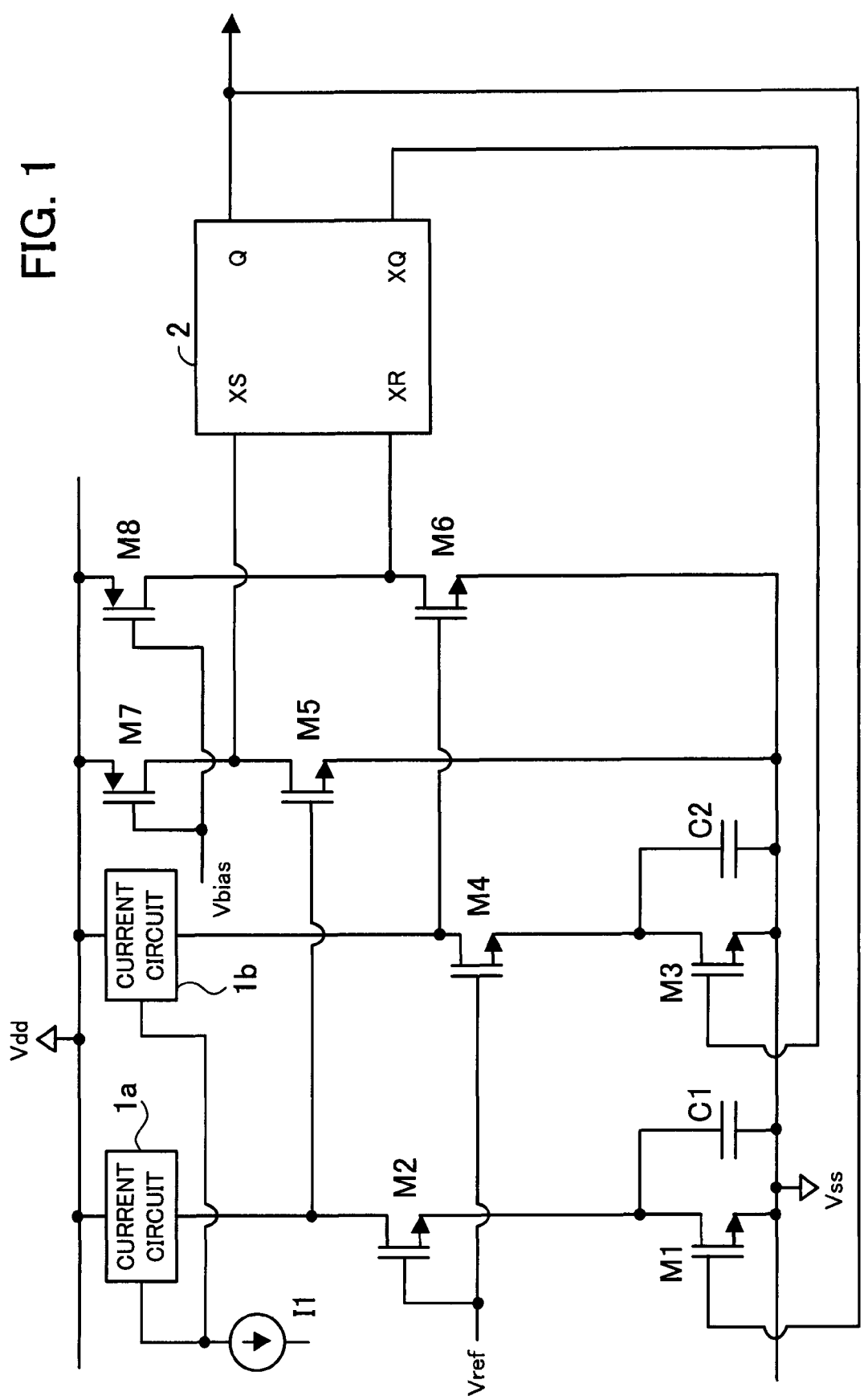
FIG. 1 is a view showing an overview of a current-controlled oscillator.

To solve the above problems, according to the embodiment, there is provided a current-controlled oscillator in which an oscillation frequency is changed in accordance with control current, as shown in FIG. 1. This current-controlled oscillator includes the following elements: two current circuits 1a and 1b for outputting charge current based on control current, capacitors C1 and C2 provided in association with the current circuits 1a and 1b, for storing the charge current, discharge transistors M1 and M3 provided in association with the capacitors C1 and C2, for discharging electric charge of the capacitors C1 and C2, on-off transistors M2 and M4 connected between the current circuits 1a and 1b and the capacitors C1 and C2, for opening and closing paths between the current circuits 1a and 1b and the capacitors C1 and C2, depending on the voltages across the capacitors C1 and C2, signal output transistors M5 and M6 provided in association with the current circuits 1a and 1b, for outputting signals depending on the charge current output from the current circuits 1a and 1b to the on-off transistors M2 and M4, and a flip-flop 2 for driving the discharge transistors M1 and M3 alternately in response to the signals.

In the current-controlled oscillator, the transistors M2 and M4 open or close the paths between the current circuit 1a and 1b and the capacitors C1 and C2 in accordance with the voltages across the capacitor C1 and C2 to be charged or discharged. When the capacitor C1 or C2 is isolated from the current circuit 1a or 1b, the signal output transistor M5 or M6 outputs a signal immediately to the flip-flop 2 in accordance with the charge current. This prevents the signal from being delayed. The signal corresponding to the voltage across the capacitor C1 or C2 is output to the flip-flop 2 without using a comparator.

To solve the above problems, according to the embodiment, there is also provided another current-controlled oscillator in which an oscillation frequency is changed in accordance with control current. This current-controlled oscillator includes a delay circuit that includes a current circuit for outputting charge current in accordance with control current, a capacitor for storing the charge current, a discharge transistor for discharging the electric charge of the capacitor, and an on-off transistor connected between the current circuit and the capacitor, for opening or closing a path between the current circuit and the capacitor in accordance with the voltage across the capacitor, and a signal output transistor for outputting a signal in accordance with the charge current output from the current circuit to the on-off transistor.

In the current-controlled oscillator, between the capacitor for storing the charge current from the delay circuit and the current circuit for supplying the charge current, the on-off transistor for opening or closing the path between the current circuit and the capacitor in accordance with the voltage across the capacitor is provided. The signal output transistor for outputting a signal in accordance with the charge current output from the current circuit to the on-off transistor is provided. This prevents the signal from being delayed. The signal corresponding to the voltage across the capacitor is output without using a comparator.

In a current-controlled oscillator of the embodiment, current circuits are isolated from capacitors in accordance with the voltages across the capacitors to be charged or discharged, and signal output transistors output signals immediately in accordance with the charge current. This prevents the signals from being delayed by the capacitors. In addition, since the signals are output from the signal output transistors to a flip-flop, without using a comparator, the frequency range can be widened without increasing the power consumption.

In a current-controlled oscillator of the embodiment, a delay circuit is configured such that a current circuit is isolated from a capacitor in accordance with the voltage across the capacitor to be charged or discharged, and a signal output transistor is provided to output a signal immediately in accordance with charge current. This prevents the signal from being delayed by the capacitor. In addition, since the signal is output from the signal output transistor, without using a comparator, the frequency range can be widened without increasing the power consumption.

The above and other objects, features and advantages of the embodiment will become apparent from the following description when taken in conjunction with the accompanying drawings which illustrate preferred embodiments of the embodiment by way of example.

The principle of the embodiment will be described below in detail with reference to a figure.

FIG. 1 is a view showing an overview of a current-controlled oscillator. As shown in the figure, the current-controlled oscillator includes NMOS discharge transistors M1 and M3, NMOS on-off transistors M2 and M4, NMOS signal output transistors M5 and M6, PMOS transistors M7 and M8, a current source I1, current circuits 1a and 1b, and a flip-flop 2.

The current circuits 1a and 1b output charge current in accordance with control current of the current source I1. The capacitors C1 and C2 are provided in association with the current circuits 1a and 1b and store charge current from the current circuits 1a and 1b. The discharge transistors M1 and M3 are provided in association with the capacitors C1 and C2 and discharge electric charge stored in the capacitors C1 and C2.

The on-off transistors M2 and M4 are provided in association with the current circuits 1a and 1b and open or close the paths between the current circuits 1a and 1b and the capacitors C1 and C2 in accordance with the voltages across the capacitors C1 and C2. For instance, the transistor M2 or M4, which receives a reference voltage Vref at its gate, is turned off when the difference between the reference voltage Vref and the voltage across the capacitor C1 or C2 falls below a threshold voltage, isolating the current circuit 1a or 1b from the capacitor C1 or C2 by high impedance.

The signal output transistors M5 and M6 are provided in association with the current circuits 1a and 1b, and their gates are connected between the current circuits 1a and 1b and the transistors M2 and M4. The signal output transistors output high and low signals to the flip-flop 2 in accordance with charge current output from the current circuits 1a and 1b. If the transistor M2 or M4 isolates the current circuit 1a or 1b from the capacitor C1 or C2 when the capacitor C1 or C2 reaches a given voltage level, the charge current is fed into the gate of the signal output transistor M5 or M6. This increases the voltage at the gate of the transistor M5 or M6 immediately (because of the very high impedance of the gate) and turns the transistor on.

The flip-flop 2 drives the discharge transistors M1 and M3 alternately in accordance with the signals from the signal output transistors M5 and M6. The transistors M7 and M8 are connected to the signal output transistors M5 and M6 respectively to form inverters. The transistors M7 and M8 receive a bias voltage Vbias at their gates and are always held on.

The current circuit 1a or 1b is isolated from the capacitor C1 or C2 in accordance with the voltage across the capacitor C1 or C2 to be charged or discharged, and the signal output transistor M5 or M6 outputs a signal immediately in accordance with the charge current. This avoids the signal from being delayed. In addition, because the signal output transistor M5 or M6 outputs the signal to the flip-flop 2, without using a comparator, the frequency range can be widened without increasing the power consumption.

One embodiment will be described next in detail with reference to figures.

Figure 2:
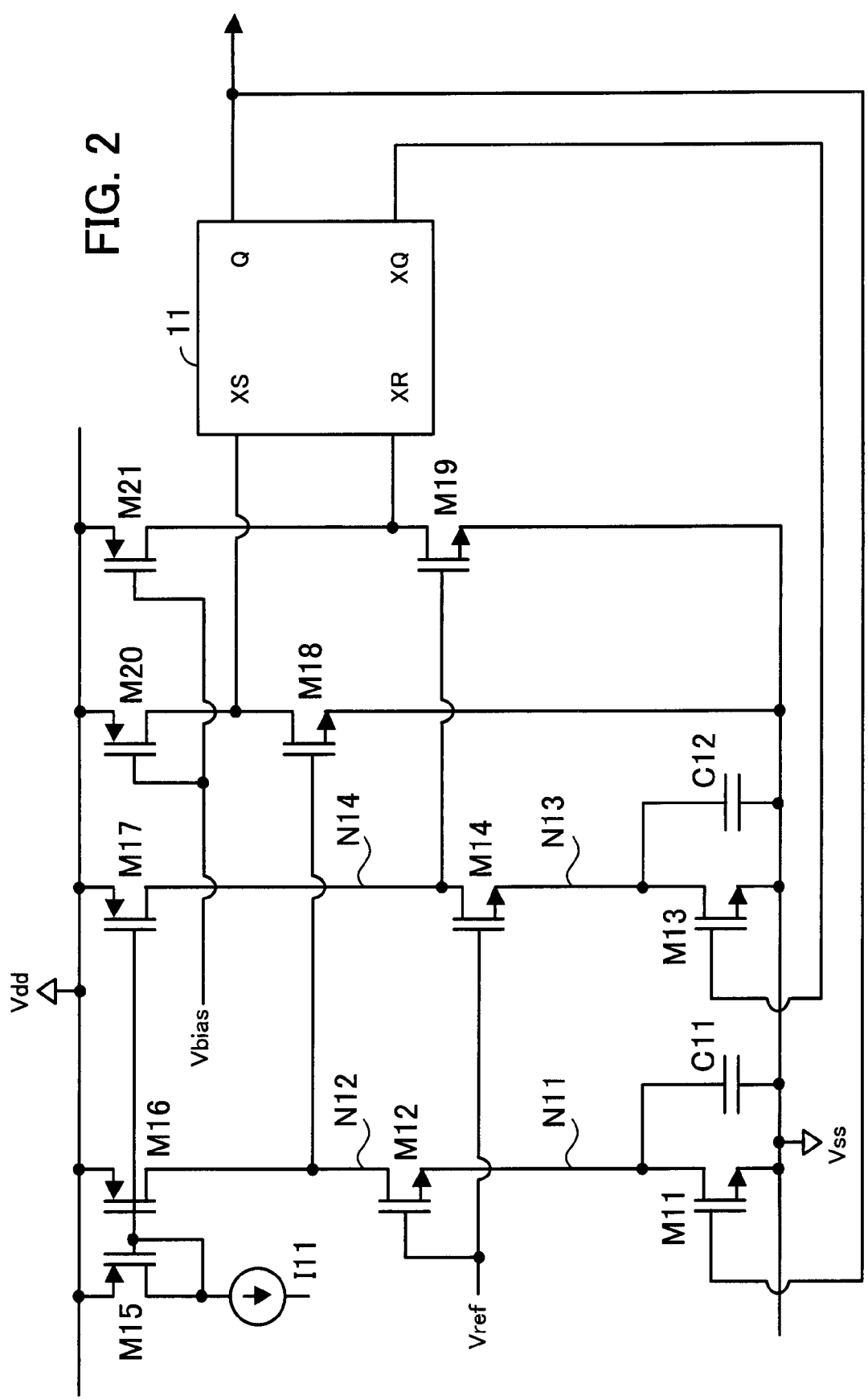
FIG. 2 is a schematic diagram of a current-controlled oscillator of one embodiment.

FIG. 2 is a schematic diagram of a current-controlled oscillator of one embodiment. As shown in FIG. 2, the current-controlled oscillator includes NMOS transistors M11 to M14, M18, and M19, PMOS transistors M15 to M17, M20, and M21, capacitors C11 and C12, a current source I11, and an RS flip-flop 11. These elements are formed on a single semiconductor chip, for instance. A node of the drain of the transistor M11 is denoted as node N11; a node of the drain of the transistor M12 is denoted as node N12; a node of the drain of the transistor M13 is denoted as node N13; and a node of the drain of the transistor M14 is denoted as node N14.

The sources of the transistors M15 and M16 are connected to a node of a power supply having a voltage Vdd. The gates of the transistors M15 and M16 are connected together to the drain of the transistor M15 and the current source I11. The drain of the transistor M16 is connected to the drain of the transistor M12.

A reference voltage Vref is input to the gate of the transistor M12. The source of the transistor M12 is connected to the drain of the transistor M11.

The gate of the transistor M11 is connected to a "Q" terminal of the flip-flop 11. The source of the transistor M11 is connected to a node of a voltage Vss (the ground voltage of the power supply having the voltage Vdd). The capacitor C11 is connected between the drain and source of the transistor M11.

The gate of the transistor M17 is connected to the gates of the transistors M15 and M16. The source of the transistor M17 is connected to a node of the voltage Vdd. The drain of the transistor M17 is connected to the drain of the transistor M14.

The reference voltage Vref is input to the gate of the transistor M14. The source of the transistor M14 is connected to the drain of the transistor M13.

The gate of the transistor M13 is connected to an "XQ" terminal of the flip-flop 11. The source of the transistor M13 is connected to the node of the voltage Vss. The capacitor C12 is connected between the drain and source of the transistor M13.

A bias voltage Vbias is input to the gates of the transistors M20 and M21. The sources of the transistors M20 and M21 are connected to the node of the voltage Vdd. The drains of the transistors M20 and M21 are connected to the drains of the transistors M18 and M19 and also to an "XS" terminal and an "XR" terminal of the flip-flop 11.

The gates of the transistors M18 and M19 are connected to the drains of the transistors M12 and M14. The sources of the transistors M18 and M19 are connected to the node of the voltage Vss.

The transistors M15 to M17 form current mirror circuits. The current mirror circuits return current of the current source I11 to the transistors M16 and M17.

The current of the current source I11 can be controlled. By controlling the amount of current of the current source I11, the charging speed of the capacitors C11 and C12 can be changed, and the frequency of oscillation signals can be changed.

The transistors M11, M12, and M16 and the capacitor C11 form one delay circuit, and the transistors M13, M14, and M17 and the capacitor C12 form another delay circuit. The oscillation signals are generated through alternate charging and discharging of the capacitors C11 and C12 of the two delay circuits. The delay circuit formed by the transistors M11, M12, and M16 and the capacitor C11 will now be described in detail.

Figure 3:
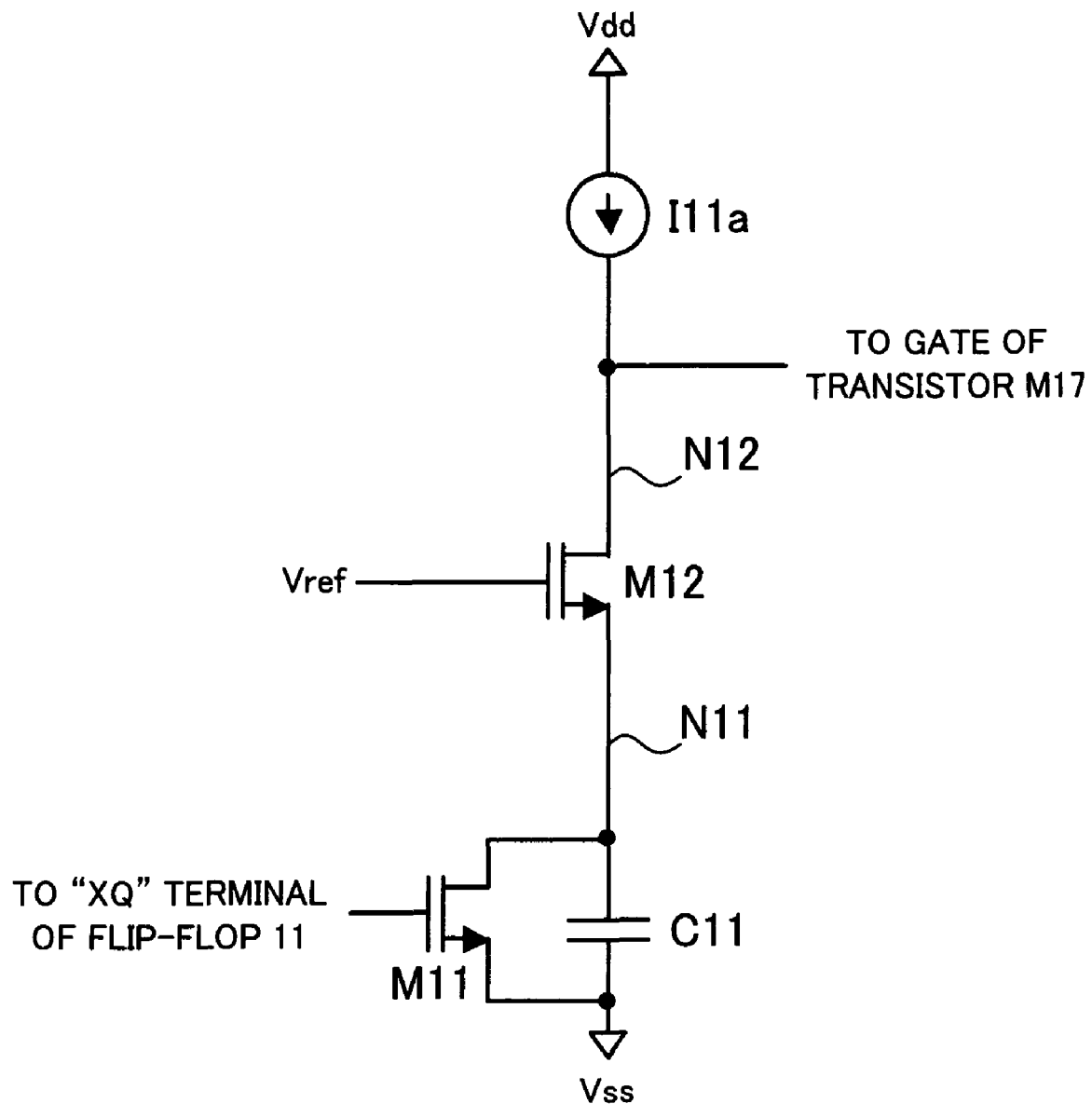
FIG. 3 is a schematic diagram of a delay circuit shown in FIG. 2.

FIG. 3 is a schematic diagram of the delay circuit shown in FIG. 2. In FIG. 3, the same elements as shown in FIG. 2 are denoted by the same symbols, and a description of those elements will be omitted.

The transistor M11 is turned on or off in accordance with a signal output from the "XQ" terminal of the flip-flop 11. When a high signal is input to the gate, the transistor M11 is turned on to discharge electric charge stored in the capacitor C11. When a low signal is input to the gate, the transistor M11 is turned off to store current (electric charge) from a current source I11a in the capacitor C11. The current source I11a indicates current flowing from the transistor M16 shown in FIG. 2.

The transistor M12 is turned on or off in accordance with the voltage across the capacitor C11 to connect or isolate the node N12 connected to the current source I11a and the node N11 connected to the capacitor C11. Suppose, for instance, that the capacitor C11 discharges electric charge and that the voltage of the node N11 is the voltage Vss. Since the potential difference between the node N11 and the gate of the transistor M12 is higher than or equal to a threshold voltage, the transistor M12 is turned on to connect the node N12 and the node N11. Conversely, if the capacitor C11 stores current from the current source I11a, the voltage of the node N11 increases, bringing the potential difference between the node N11 and the gate of the transistor M12 lower than the threshold voltage. This turns off the transistor M12, isolating the node N12 from the node N11 by high impedance.

Suppose that the threshold voltage of the transistor M12 is 0.6 V and that the reference voltage Vref input to the gate of the transistor M12 is 1.2 V, for instance. It is assumed that the capacitor C11 is discharged by the transistor M11 and that the voltage of the node N11 is the voltage Vss (0 V). In that case, the source-gate voltage of the transistor M12 is 1.2 V, and the transistor M12 is turned on. The transistor M12 in the "on" state connects the node N12 and the node N11, and the capacitor C11 stores the current of the current source I11a.

When the charged capacitor C11 increases the voltage of the node N11 to a level higher than or equal to 0.6 V, the potential difference between the source and gate of the transistor M12 becomes lower than 0.6 V. This turns off the transistor M12, isolating the node N12 from the node N11.

In the delay circuit formed by the transistors M13, M14, and M17 and the capacitor C12 shown in FIG. 2, the transistor M14 is turned on or off in accordance with the voltage across the capacitor C12, connecting or isolating the node N14 connected to the transistor M17 and the node N13 connected to the capacitor C12 in the same way.

The description of FIG. 2 will now resume. When the transistor M12 is turned off, the node N12 and the node N11 are isolated as described earlier. This increases the gate voltage of the transistor M18 in accordance with current from the transistor M16 and turns on the transistor M18. In the same way, when the transistor M14 is turned off, the node N14 and the node N13 are isolated. This increases the gate voltage of the transistor M19 in accordance with current from the transistor M17 and turns on the transistor M19.

The transistors M20 and M18 form one inverter, and the transistors M21 and M19 form another inverter. The transistors M20 and M21 have the bias voltage Vbias at their gates and are always kept on. Therefore, when the transistor M18 or M19 is turned off, a node of the drain of the transistor M18 or M19 goes high. When the transistor M18 or M19 is turned on, the node goes low.

When the transistor M18 is turned on, the drain node goes low, and a low signal is input to the "XS" terminal of the flip-flop 11. When the capacitor C11 stores electric charge and the capacitor C11 reaches a given voltage level, the transistor M12 is turned off, and the transistor M18 is turned on. Then, a low signal is input to the "XS" terminal of the flip-flop 11. With the low signal input to the "XS" terminal, the flip-flop 11 outputs a high signal from the "Q" terminal and a low signal from the "XQ" terminal.

The high signal output from the "Q" terminal of the flip-flop 11 turns on the transistor M11, causing electric charge stored in the capacitor C11 to be discharged. On the other hand, the low signal output from the "XQ" terminal turns off the transistor M13, causing the capacitor C12 to store the current from the transistor M17. When the voltage across the capacitor C12 reaches a given voltage level, the transistor M14 is turned off, and the transistor M19 is turned on. Then, a low signal is input to the "XR" terminal of the flip-flop 11. With the low signal input to the "XR" terminal, the flip-flop 11 outputs a low signal from the "Q" terminal and a high signal from the "XQ" terminal.

The low signal output from the "Q" terminal of the flip-flop 11 turns off the transistor M11, causing the capacitor C11 to store current from the transistor M16. On the other hand, the high signal output from the "XQ" terminal of the flip-flop 11 turns on the transistor M13, causing electric charge stored in the capacitor C12 to be discharged. The capacitors C11 and C12 repeat the alternate charging and discharging.

Figure 9:
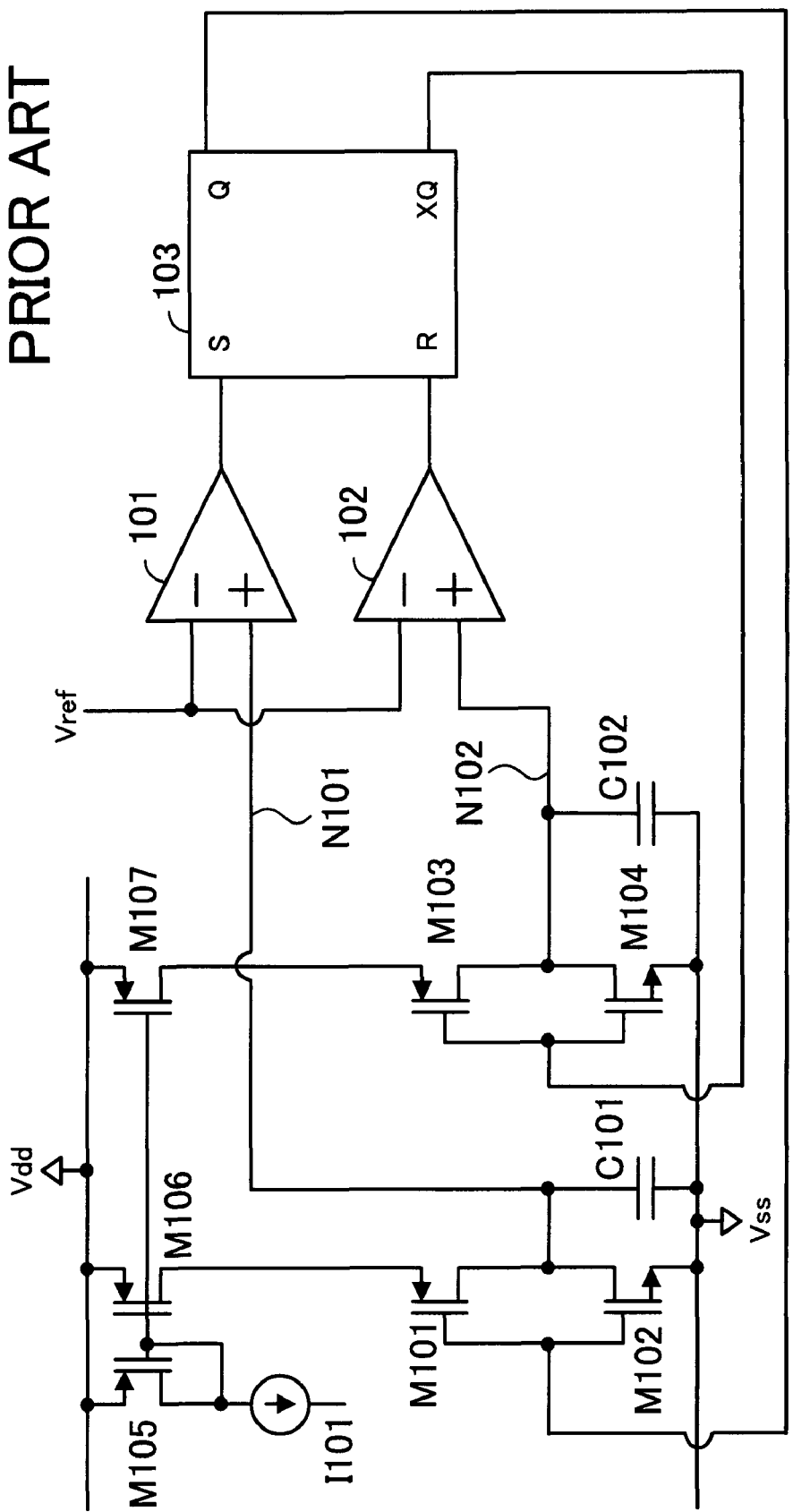
FIG. 9 is a schematic diagram of a conventional current-controlled oscillator using two grounded capacitors.
Figure 10:
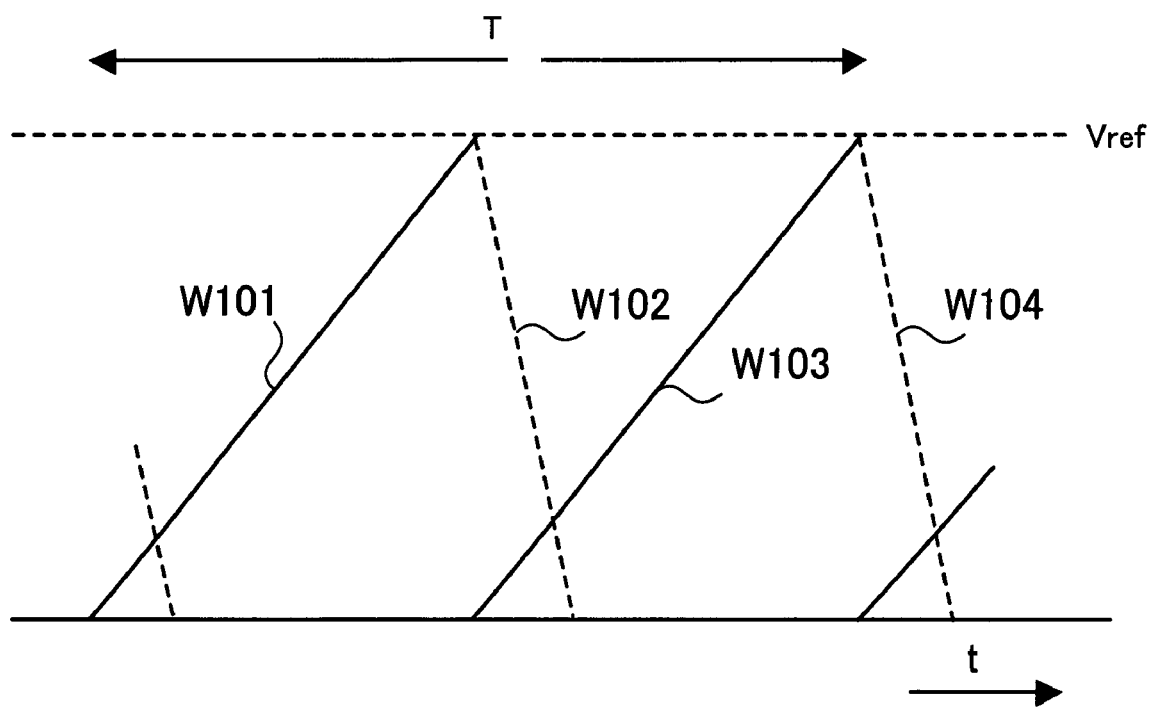
FIG. 10 is a view illustrating charging and discharging of a capacitor.
Figure 11:
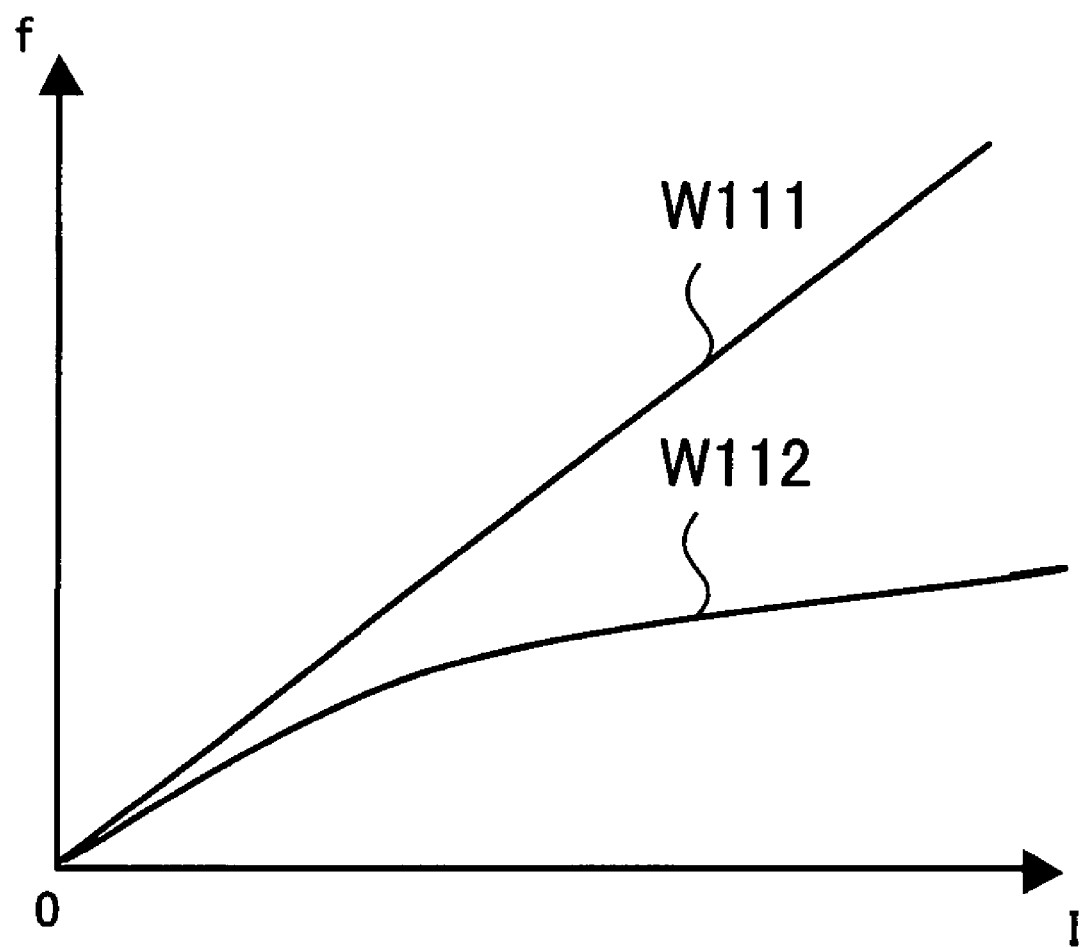
FIG. 11 is a view showing the relationship between current stored in a capacitor and the frequency of the oscillation signal.

In the current-controlled oscillator shown in FIG. 2, when the voltage across the capacitor C11 reaches the given voltage level, the transistor M12 isolates the node N11 from the node N12. Consequently, an on-off delay of the transistor M18 results just from the parasitic capacitance of the transistors M12 and M16 and the gate capacitance of the transistor M18 itself, and the transistor M18 can be turned on or off independently of the capacitance of the capacitor C11. Because the parasitic capacitance of the transistors M12 and M16 and the gate capacitance of the transistor M18 are very small, the on-off delay of the transistor M18 becomes very small. The voltage across the capacitor C11 is compared and determined without using the comparator 101, unlike FIG. 9, so that the determination delay becomes very small. In the same way, the transistor M14 isolates the node N13 from the node N14 when the voltage across the capacitor C12 reaches the given voltage level. An on-off delay of the transistor M19 results just from the parasitic capacitance of the transistors M14 and M17 and the gate capacitance of the transistor M19 itself, and the transistor M19 can be turned on or off independently of the capacitance of the capacitor C12. Because the parasitic capacitance of the transistors M14 and M17 and the gate capacitance of the transistor M19 are very small, the on-off delay of the transistor M19 becomes very small. The voltage across the capacitor C12 is compared and determined without using the comparator 102, unlike FIG. 9, so that the determination delay is very small.

Changes in voltage at different parts will next be described.

Figure 4:
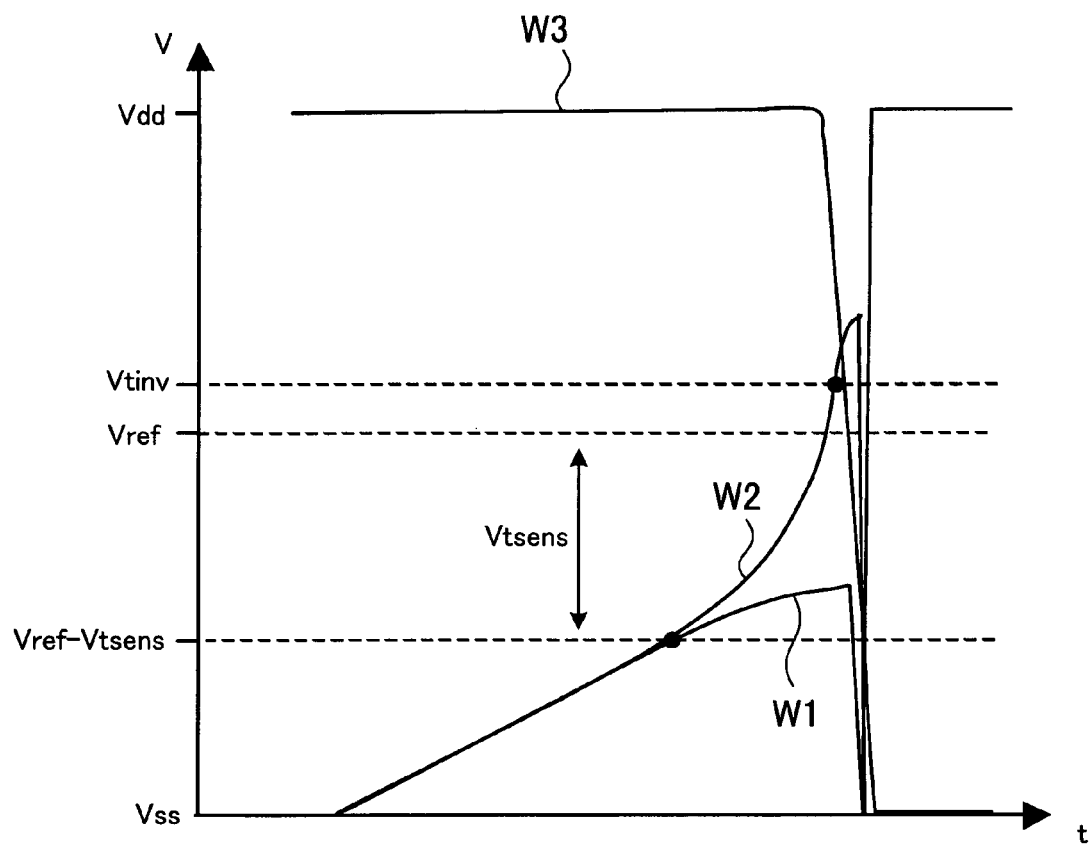
FIG. 4 is a view showing changes in voltage in different parts of the current-controlled oscillator.

FIG. 4 is a view showing changes in voltage at different parts of the current-controlled oscillator. A waveform W1 in the figure represents a change in voltage in the node N11 shown in FIG. 2. A waveform W2 represents a change in voltage in the node N12. A waveform W3 represents a change in voltage of the signal input to the "XS" terminal of the flip-flop 11. Vref in the figure denotes the reference voltage Vref input to the gate of the transistor M12; Vtsens denotes the threshold voltage of the transistor M12; Vref−Vtsens denotes the voltage of the node N11 of the transistor M12 to be turned on or off. Vtinv denotes the voltage at which the transistor M18 is turned on or off.

It is assumed that the capacitor C11 stores no electric charge initially and that the voltage of the node N11 is the voltage Vss (0 V). When the transistor M11 is turned off, the capacitor C11 stores current from the transistor M16.

As the capacitor C11 stores current from the transistor M16, the voltage of the node N11 increases as indicated by the waveform W1. When the voltage of the node N11 increases up to the level of Vref−Vtsens, the transistor M12 is turned off. Then, the increase in voltage of the node N11 slows down and stops, as indicated by the waveform W1. On the other hand, the stop of current supply to the capacitor C11 increases the voltage of the node N12 rapidly, as indicated by the waveform W2.

When the voltage of the node N12 exceeds Vtinv, the transistor M18 is turned on. This brings the signal input to the "XS" terminal of the flip-flop 11 to the voltage Vss (low) from the voltage Vdd (high), as indicated by the waveform W3. The input of the low signal into the "XS" terminal causes the flip-flop 11 to output a high signal from the "Q" terminal.

The high signal output from the "Q" terminal of the flip-flop 11 turns on the transistor M11. This causes the capacitor C11 to discharge and brings the voltage of the node N11 to the voltage Vss, as indicated by the waveform W1. The voltage Vss of the node N11 causes the transistor M12 to be turned on and brings the voltage of the node N12 to the voltage Vss, as indicated by the waveform W2. The voltage Vss of the node N12 causes the transistor M18 to be turned off and brings the signal input to the "XS" terminal of the flip-flop 11 high, as indicated by the waveform W3.

Variations occur in the threshold voltages of the transistors M12 and M14, depending on the fabrication process. This would result in differences in charge or discharge time of the capacitors C11 and C12 among individual current-controlled oscillators, and different frequencies may be generated from the same current. Therefore, the transistors M12 and M18 are formed to have the same characteristics, and the transistors M14 and M19 are formed to have the same characteristics. The transistors M12 and M18 are formed nearby, and the transistors M14 and M19 are formed nearby. This enables variations in the charge or discharge time depending on variations in the threshold voltages of the transistors M12 and M14 to be compensated for.

If the threshold voltage of the transistor M12 is higher than a design value, for instance, the transistor M12 would be turned on before the voltage of the node N11 reaches a designed voltage level. However, like the transistor M12, the transistor M18 also has a higher threshold voltage, so that the turning on of the transistor M18 is delayed. That is, the transistor M18 cancels out the early turning on of the transistor M12. With the transistors M12 and M18 and the transistors M14 and M19 formed to have the same characteristics, variations in the charge or discharge time depending on variations in the threshold voltages of the transistors M12 and M14 can be compensated for.

The circuit of the flip-flop 11 will next be described in detail.

Figure 5:
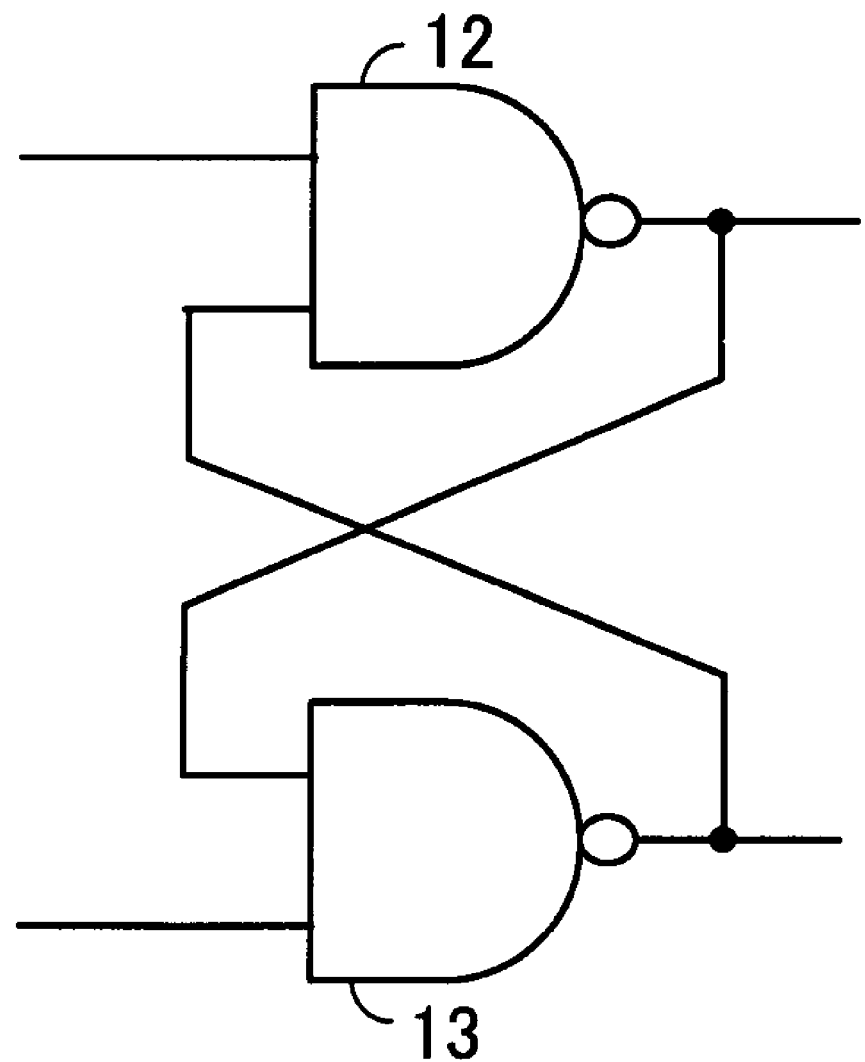
FIG. 5 is a schematic diagram of a flip-flop.

FIG. 5 is a schematic diagram of the flip-flop. As shown in the figure, the flip-flop 11 is formed of NAND circuits 12 and 13. One input of the NAND circuit 12 is connected to the drain of the transistor M18. One input of the NAND circuit 13 is connected to the drain of the transistor M19. The other input of the NAND circuit 12 is connected to the output of the NAND circuit 13, and the other input of the NAND circuit 13 is connected to the output of the NAND circuit 12. The output of the NAND circuit 12 is connected to the gate of the transistor M11, and the output of the NAND circuit 13 is connected to the gate of the transistor M13. The one input of the NAND circuit 12 corresponds to the "XS" terminal, and the one input of the NAND circuit 13 corresponds to the "XR" terminal. The output of the NAND circuit 12 corresponds to the "Q" terminal, and the output of the NAND circuit 13 corresponds to the "XQ" terminal.

Figure 6:
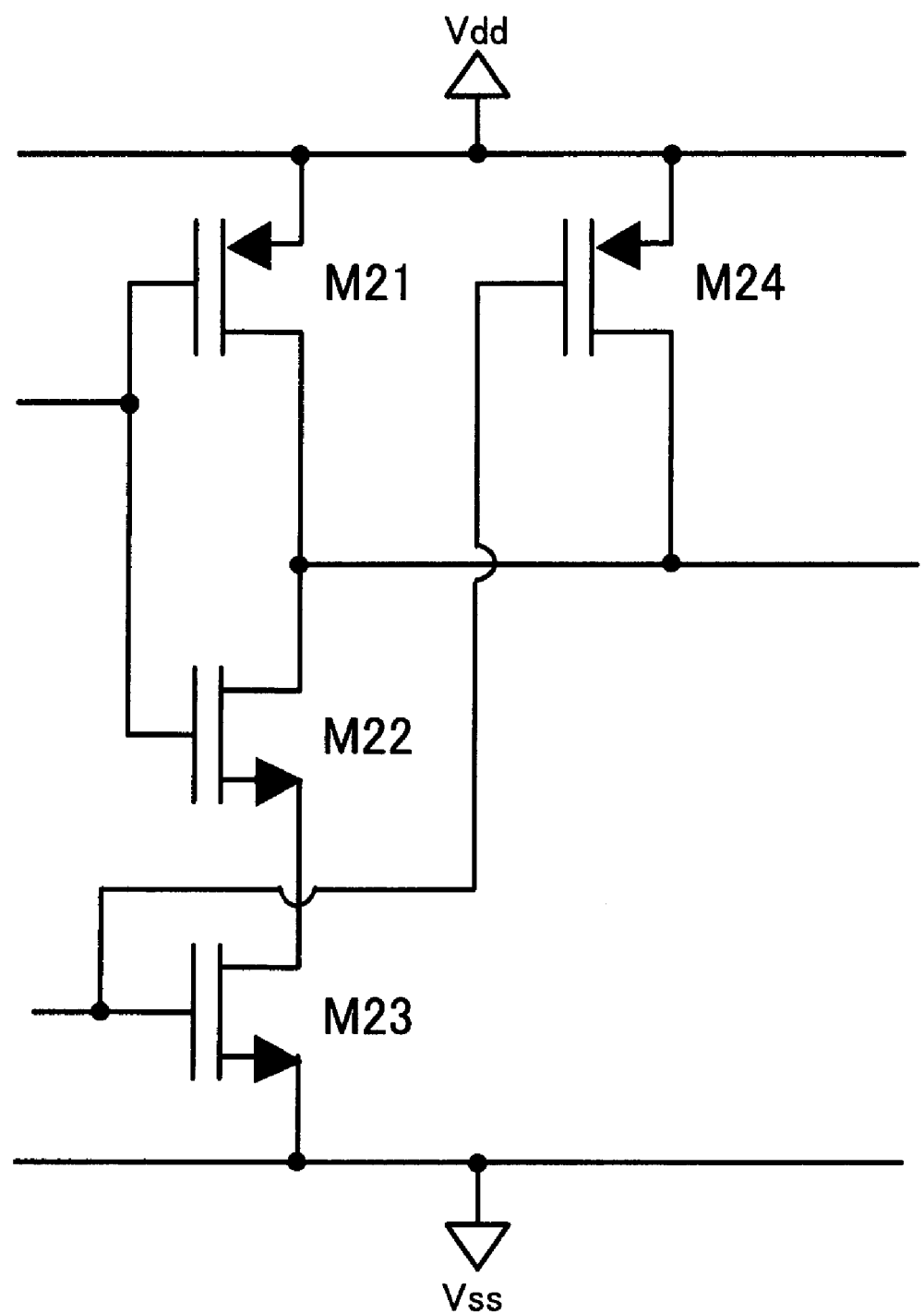
FIG. 6 is a detailed schematic diagram of a NAND circuit shown in FIG. 5.

FIG. 6 is a detailed schematic diagram of a NAND circuit shown in FIG. 5. As shown in the figure, the NAND circuit 12 includes PMOS transistors M21 and M24 and NMOS transistors M22 and M23. The NAND circuit 13 has the same circuit structure as shown in FIG. 6, and a description thereof will be omitted.

The source of the transistor M21 is connected to the node of the voltage Vdd. The transistor M21 has its gate connected to the gate of the transistor M22 and its drain connected to the drain of the transistor M22. The source of the transistor M22 is connected to the drain of the transistor M23.

The source of the transistor M23 is connected to the node of the voltage Vss. The gate of the transistor M23 is connected to the gate of the transistor M24. The transistor M24 has its source connected to the node of the voltage Vdd and its drain connected to the drains of the transistors M21 and M22.

The gates of the transistors M21 and M22 correspond to the one input of the NAND circuit 12 shown in FIG. 5. The gate of the transistor M23 corresponds to the other input of the NAND circuit 12. The drains of the transistors M21 and M22 correspond to the output of the NAND circuit 12. A signal coming from the transistor M18 is input to the transistors M21 and M22.

Now, the gate lengths of the transistors M21 and M22 are increased to increase the threshold voltages. This prevents the transistors M21 and M22 forming an inverter from being turned on simultaneously, blocking a flow-through current from flowing through the transistors M21 and M22. Consequently, the power consumption by the flip-flop 11 is reduced.

The relationship between the current of the current source I11 and the frequency of an oscillation signal will next be described.

Figure 7:
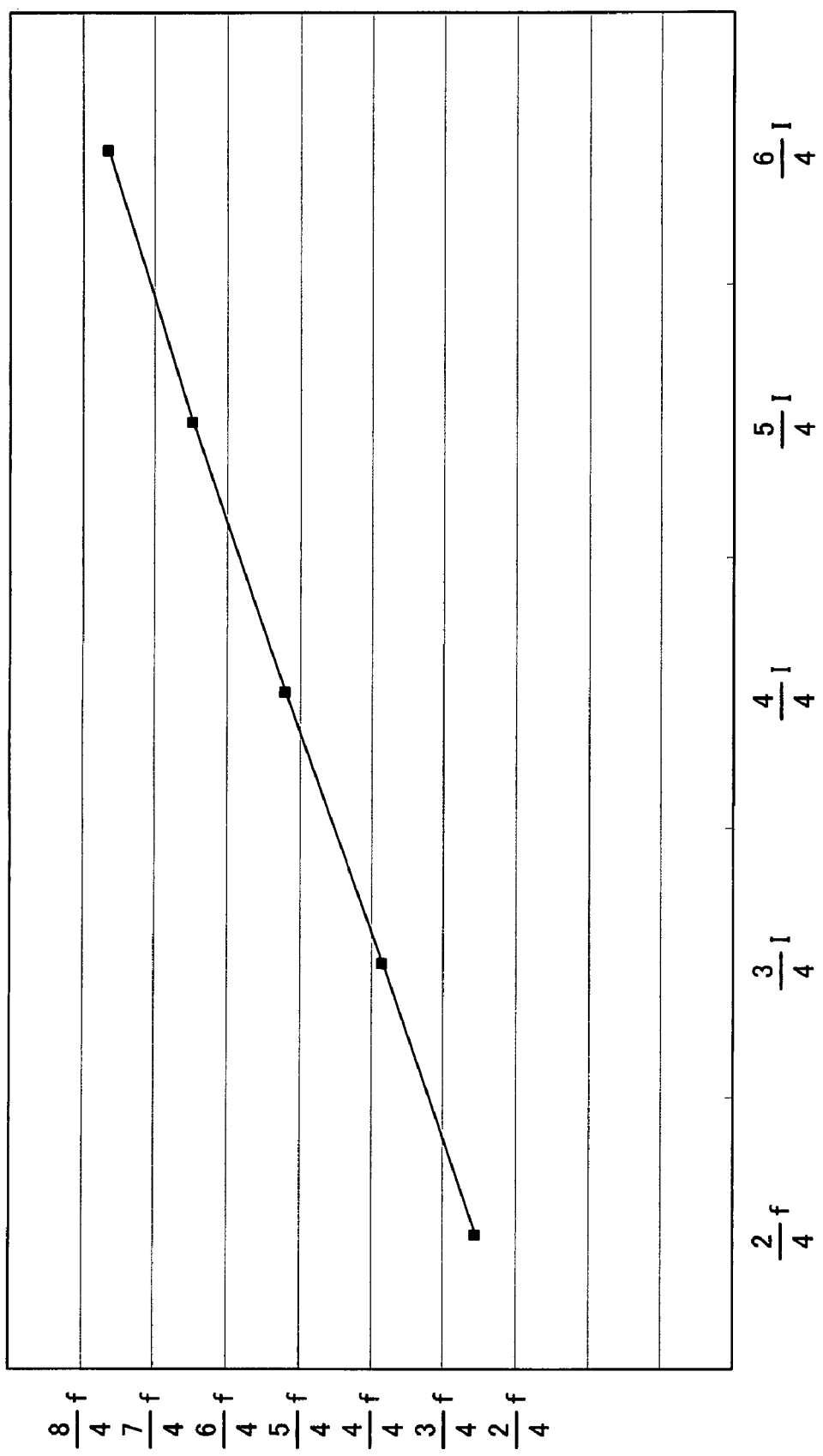
FIG. 7 is a view showing the relationship between control current and the frequency of oscillation signals of the current-controlled oscillator shown in FIG. 2.

FIG. 7 is a view showing the relationship between control current and the frequency of an oscillation signal of the current-controlled oscillator shown in FIG. 2. The horizontal axis of the figure indicates current flowing from the current source I11; and the vertical axis indicates the frequency of the oscillation signal taken from the node N11 or N13. As shown in FIG. 7, the current-controlled oscillator shown in FIG. 2 increases the frequency of the oscillation signal in proportion to the increase in current of the current source I11. Therefore, the frequency range of the oscillation signal can be widened.

As has been described above, the transistor M16 or M17 to supply current is isolated from the capacitor C11 or C12 in accordance with the voltage across the capacitor C11 or C12 to be charged or discharged, and the transistor M18 or M19 outputs a high or low signal immediately in accordance with current from the transistor M16 or M17. Consequently, a signal delay is avoided. Since the transistors M18 and M19 output signals to the flip-flop 11, without using a comparator, the frequency range can be widened without increasing the power consumption.

Since the transistors M12 and M18 and the transistors M14 and M19 are formed so as to have the same characteristics, variations in the charge or discharge time depending on variations in the threshold voltages of the transistors M12 and M14 can be compensated for.

Because the transistors M18 and M19 and the transistors M20 and M21 are provided to form inverters, the switching pulses of the signals output to the flip-flop 11 can be made steeper.

Another embodiment will next be described in detail with reference to a figure.

Figure 8:
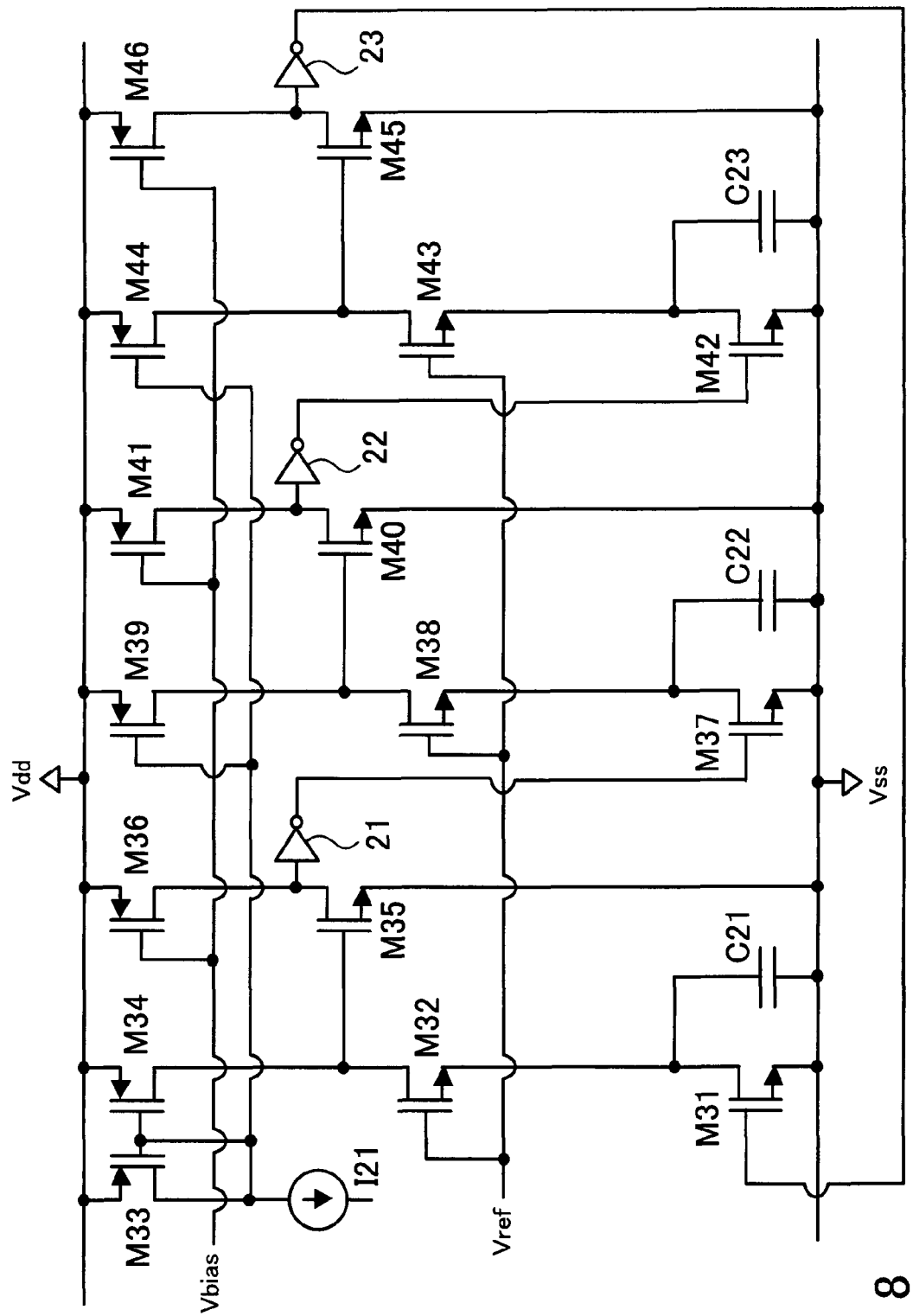
FIG. 8 is a schematic diagram of a current-controlled oscillator of another embodiment.

FIG. 8 is a schematic diagram of a current-controlled oscillator of another embodiment. As shown in FIG. 8, the current-controlled oscillator includes NMOS transistors M31, M32, M35, M37, M38, M40, M42, M43, and M45, PMOS transistors M33, M34, M36, M39, M41, M44, and M46, capacitors C21 to C23, and inverters 21 to 23.

Like the transistors M11, M12, and M16 and the capacitor C11 shown in FIG. 2, the transistors M31, M32, and M34 and the capacitor C21 form a delay circuit. The transistors M37, M38, and M39 and the capacitor C22 also form a delay circuit. In addition, the transistors M42, M43, and M44 and the capacitor C23 form a delay circuit.

The transistors M33, M34, M39, and M44 form current mirror circuits. The current mirror circuits return current of a current source I21 to the transistors M34, M39, and M44.

The current of the current source I21 can be controlled in the same way as the current of the current source I11 shown in FIG. 2. By controlling the amount of current of the current source I21, the charging speed of the capacitors C21 to C23 can be changed, and the frequency of the oscillation signals can be changed.

Like the transistors M18 and M20 show in FIG. 2, the transistors M35 and M36 form an inverter. When the voltage across the capacitor C21 increases to turn off the transistor M32, the transistor M35 is turned on and outputs a low signal to an inverter 21. The inverter 21 inverts a signal output from the transistor M35 in order that the capacitor C22 is discharged when the capacitor C21 is charged, or the capacitor C22 is charged when the capacitor C21 is discharged. The transistors M40 and M41 and the transistors M45 and M46 also form inverters. Inverters 22 and 23 invert signals output from the transistors M40 and M45 respectively.

In another embodiment of FIG. 8, an odd number of delay circuit stages are connected to invert charging and discharging for oscillation. The current-controlled oscillator of another embodiment of FIG. 8 includes an odd number of stages of a delay circuit (the transistors M11, M12, and M16 and the capacitor C1 shown in FIG. 2, for instance) and an inverter (the transistors M18 and M20 shown in FIG. 2, for instance) described in one embodiment of FIG. 2, connected for oscillation. The connection of the elements and the operation in the circuit blocks are the same as in one embodiment of FIG. 2, and a description thereof will be omitted.

The delay circuits are formed to isolate the transistors for outputting charge current, from the capacitors in accordance with the voltages across the capacitors to be charged or discharged, and the signal output transistors output signals immediately in accordance with the charge current. This prevents the signals from being delayed by the capacitors. In addition, since the transistors output the signals, without using a comparator, the frequency range can be widened without increasing the power consumption.

By forming the transistors M32 and M35, the transistors M38 and M40, and the transistors M43 and M45 to have the same characteristics in the same way as in one embodiment of FIG. 2, variations in the charge or discharge time caused by variations in threshold voltage can be compensated for.

The transistors M35, M40, and M45 and the transistors M36, M41, and M46 are provided to form inverters, so that the switching pulses of the signals output to the inverters 21 to 23 can be made steeper.

FIG. 8 shows an example of connecting three stages of delay circuits, but an odd number of stages greater than three stages can be connected to form a current-controlled oscillator.

The foregoing is considered as illustrative only of the principles of the embodiment. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A current-controlled oscillator in which an oscillation frequency is changed in accordance with control current, comprising:
    two current circuits outputting charge current based on the control current;
    capacitors provided in association with the current circuits and storing the charge current;
    discharge transistors provided in association with the capacitors and causing the capacitors to discharge electric charge;
    on-off transistors connected between the current circuits and the capacitors, and opening or closing paths between the current circuits and the capacitors in accordance with the voltages across the capacitors;
    signal output transistors connected between the current circuits and the on-off transistors, wherein the charge current is provided to gates of the signal output transistors when the on-off transistors are off; and
    a flip-flop driving the discharge transistors alternately in accordance with the signals.

2. The current-controlled oscillator according to claim 1, wherein the on-off transistors and the signal output transistors are formed to have same characteristics.

3. The current-controlled oscillator according to claim 1, wherein the signal output transistors form inverters.

4. The current-controlled oscillator according to claim 1, wherein the current circuits are formed by current mirror circuits.

5. The current-controlled oscillator according to claim 1, wherein each input of the flip-flop is formed by an inverter, and two transistors forming the inverter have different threshold values.

6. A current-controlled oscillator in which an oscillation frequency is changed in accordance with control current, comprising:
    a delay circuit comprising:
        a current circuit outputting charge current based on the control current;
        a capacitor storing the charge current;
        a discharge transistor causing the capacitor to discharge electric charge; and
        an on-off transistor connected between the current circuit and the capacitor, and opening or closing a path between the current circuit and the capacitor in accordance with the voltage across the capacitor; and
    a signal output transistor connected between the current circuit and the on-off transistor, wherein the charge current is provided to a gate of the signal output transistor when the on-off transistor is off.

7. The current-controlled oscillator according to claim 6, wherein an odd number of stages each including the delay circuit and the signal output transistor are connected in a loop.

* * * * *